(12) United States Patent
Kushibe

(10) Patent No.: US 6,826,248 B2
(45) Date of Patent: Nov. 30, 2004

(54) PHASE LOCKED LOOP CIRCUIT

(75) Inventor: Hidefumi Kushibe, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 466 days.

(21) Appl. No.: 09/817,028

(22) Filed: Mar. 27, 2001

(65) Prior Publication Data
US 2001/0028694 A1 Oct. 11, 2001

(30) Foreign Application Priority Data
Mar. 27, 2000 (JP) ........................................ 2000-086171

(51) Int. Cl.[7] .............................................. H03D 3/24
(52) U.S. Cl. ...................... 375/376; 375/374; 375/375; 327/146; 327/148; 327/156; 327/157
(58) Field of Search ................................ 375/376, 327, 375/375, 374; 327/147, 148, 156, 157

(56) References Cited

U.S. PATENT DOCUMENTS

| | | | | |
|---|---|---|---|---|
| 5,276,408 A | * | 1/1994 | Norimatsu | 331/8 |
| 5,781,048 A | * | 7/1998 | Nakao et al. | 327/157 |
| 6,121,844 A | * | 9/2000 | Suzuki | 331/17 |
| 6,172,571 B1 | * | 1/2001 | Moyal et al. | 331/11 |
| 6,320,435 B1 | * | 11/2001 | Tanimoto | 327/156 |
| 6,411,144 B1 | * | 6/2002 | Matsuno | 327/157 |
| 2001/0045849 A1 | * | 11/2001 | Kurita | 327/156 |

FOREIGN PATENT DOCUMENTS

JP 6-343040 12/1994

\* cited by examiner

Primary Examiner—Temesghen Ghebretinsae
(74) Attorney, Agent, or Firm—Oblon, Spivak, McClelland, Maier & Neustadt, P.C.

(57) ABSTRACT

There is disclosed a phase locked loop circuit comprising a phase frequency comparator configured to output an up/down signal indicating a phase difference and a frequency difference between a reference signal and a frequency divided signal, a charge pump configured to output a current signal in accordance with said up/down signal, an oscillator configured to output an oscillation signal of a frequency in accordance with said current signal, frequency dividing parts configured to divide the frequency of said oscillation signal and generating said frequency divided signal, phase frequency judging parts configured to judge whether or not the phase difference and the frequency difference between said reference signal and said frequency divided signal exceed a predetermined reference value, and changeover parts configured to switch a value of a current flowing through said charge pump depending upon whether or not the phase difference and the frequency difference between said reference signal and said frequency divided signal exceed said reference value.

14 Claims, 8 Drawing Sheets

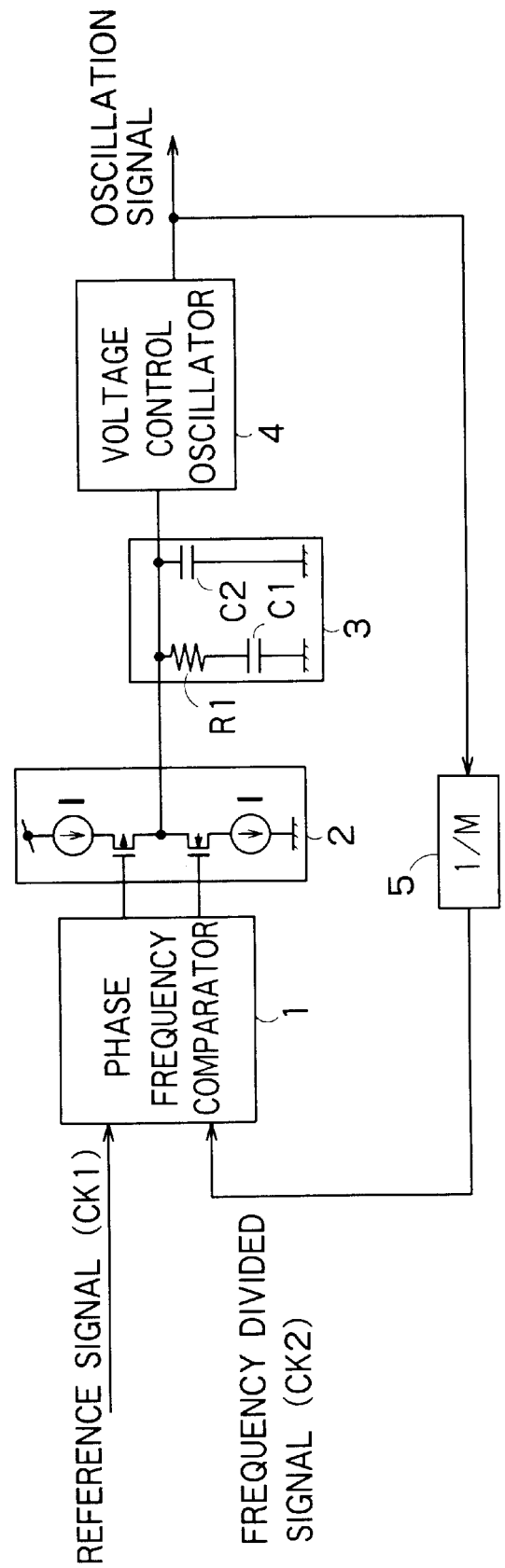
F I G. 1

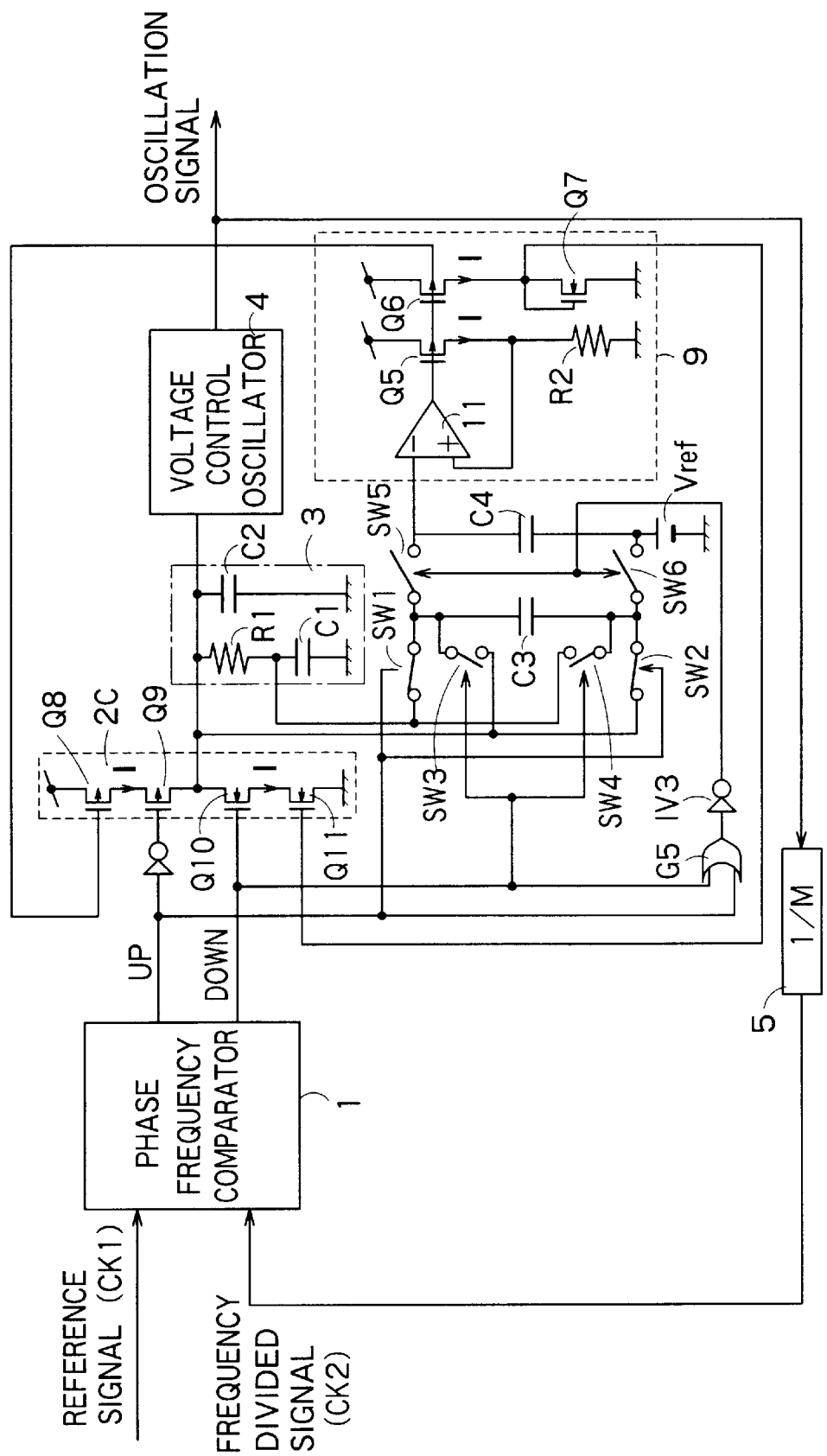
F I G. 4

| UP | DOWN | SW1 | SW2 | SW3 | SW4 | SW5 | SW6 |
|---|---|---|---|---|---|---|---|
| H | L | ON | ON | OFF | OFF | OFF | OFF |
| L | H | OFF | OFF | ON | ON | OFF | OFF |
| L | L | OFF | OFF | OFF | OFF | ON | ON |

FIG. 5

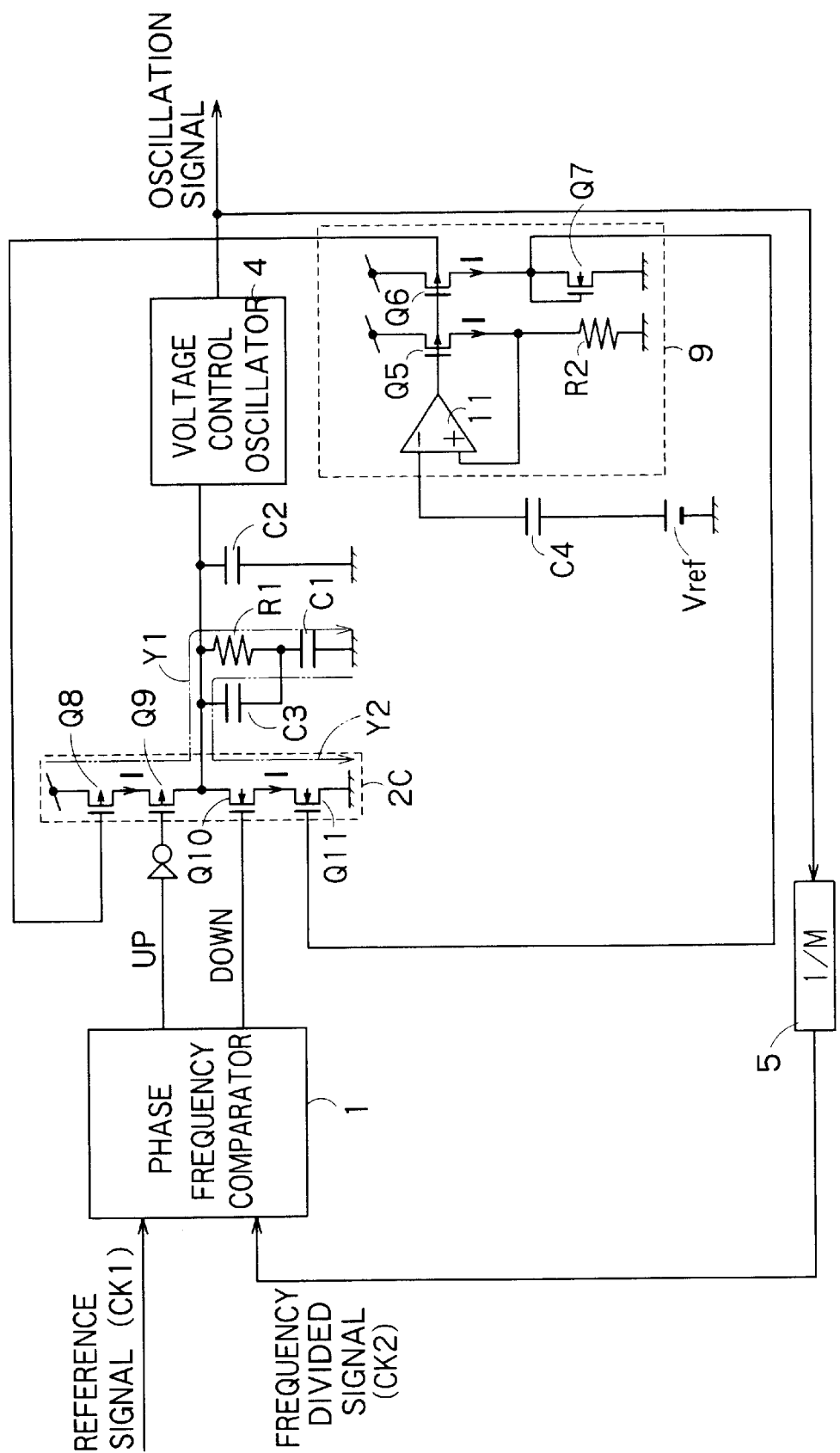
F I G. 6

PHASE LOCKED LOOP CIRCUIT

CROSS REFERENCE TO RELATED APPLICATIONS

This application claims the priority right under 35 U.S.C. 119 of Japanese Patent Application No. 2000-86171 filed on Mar. 27, 2000.

BACKGROUND OF THE INVENTION

1. Field of the Invention

The present invention relates to a phase locked loop (PLL) circuit for performing a feedback control in such a manner that a phase difference and a frequency difference between a frequency divided signal generated by dividing a frequency of an oscillation signal and a reference signal becomes zero.

2. Related Background Art

FIG. 1 is a block diagram showing a schematic diagram of a conventional phase locked loop (PLL) circuit. As shown in FIG. 1, the conventional PLL circuit includes a phase frequency comparator 1 for outputting UP and DOWN signals in accordance with a phase difference and frequency difference between a reference signal CK1 and a frequency divided signal CK2 generated by dividing a frequency of an oscillation signal, a charge pump 2 whose current value changes in accordance with the UP and DOWN signals, a loop filter 3 constituted of a resistance element R1 and capacitor elements C1, C2, a voltage control oscillator 4 for outputting an oscillation signal of a frequency corresponding to an output voltage of the loop filter 3, and a frequency divider 5 for dividing into 1/M times the frequency of the oscillation signal to generate the frequency divided signal CK2.

In the PLL circuit of FIG. 1, when the frequency and the phase of the frequency divided signal CK2 are behind those of the reference signal CK1, a current flows to the loop filter 3 from the charge pump 2 and control is performed to raise an input voltage of the voltage control oscillator 4. Conversely, when the frequency and the phase of the frequency divided signal CK2 are ahead of those of the reference signal CK1, the current flows to the charge pump 2 from the loop filter 3 and control is performed to lower the input voltage of the voltage control oscillator 4. By such control, the frequency and the phase of the frequency divided signal CK2 are controlled to meet those of the reference signal CK1.

A time required for allowing the frequency and the phase of the frequency divided signal CK2 to meet those of the reference signal CK1 is called lock-in time. A shorter lock-in time is more preferable. To shorten the lock-in time, it is only necessary to increase a value of the current flowing through the charge pump 2, or to reduce capacitance of the capacities C1, C2 of the loop filter 3.

However, simply when the value of the current flowing through the charge pump 2 is increased, or the capacitance of the capacities C1, C2 of the loop filter 3 a reduced, jitter increases, and an oscillation operation disadvantageously becomes unstable. That is, a stable operation of the PLL circuit and reduction of the lock-in time are originally contradictory to each other, and it is difficult to satisfy both conditions.

Furthermore, PLL circuit characteristics such as the lock-in time and jitter characteristics possibly fluctuate because of manufacturing dispersions of components constituting the PLL circuit, temperature or voltage fluctuation. Additionally, there is possibility that a system for utilizing the oscillation signal generated in the PLL circuit malfunctions.

SUMMARY OF THE INVENTION

The present invention has been developed in consideration of this respect, and an object thereof is to provide a phase locked loop circuit which can shorten a lock-in time and stabilize an oscillating operation.

To achieve the aforementioned object, there is provided a phase locked loop circuit comprising:

a phase frequency comparator configured to output an up/down signal indicating a phase difference and a frequency difference between a reference signal and a frequency divided signal;

a charge pump configured to output a current signal in accordance with said up/down signal;

oscillator configured to output an oscillation signal of a frequency in accordance with said current signal;

frequency dividing parts configured to divide the frequency of said oscillation signal and generating said frequency divided signal;

phase frequency judging parts configured to judge whether or not the phase difference and the frequency difference between said reference signal and said frequency divided signal exceed a predetermined reference value; and changeover parts configured to switch a value of a current flowing through said charge pump depending upon whether or not the phase difference and the frequency difference between said reference signal and said frequency divided signal exceed said reference value.

According to the present invention, the current value of the current signal for controlling the oscillator is changed based on the phase and frequency differences between the reference signal and the frequency divided signal. Therefore, when the phase and frequency differences are large, the current value of the current signal is increased, and the lock-in time is shortened. When the phase and frequency differences are small, the current value of the current signal is reduced and the oscillating operation can be stabilized.

Moreover, according to the present invention, there is provided a phase locked loop circuit comprising:

a phase frequency comparator configured to output an up/down signal indicating a phase difference and a frequency difference between a reference signal and a frequency divided signal;

a charge pump configured to output a current signal in accordance with said up/down signal;

loop filter, configured to remove a high frequency component included in said current signal, said loop filter having a resistance element;

oscillator configured to output an oscillation signal of a frequency in accordance with an output voltage of said loop filter;

frequency dividing parts configured to divide the frequency of said oscillation signal to generate said frequency divided signal;

voltage detector configured to detect a voltage at both ends of said resistance element in said loop filter; and current adjusting parts configured to adjust a value of a current flowing through said charge pump based on the detected voltage.

In the present invention, response characteristics of a phase locked loop are identified based on a result of the detected voltage at both ends of the resistance element in the filter, and the charge pump current is variably controlled in order to constantly optimize the response characteristics of the phase locked loop. Therefore, the phase locked loop circuit constantly indicates optimum response characteristics independently of manufacturing deviations, power voltage, and temperature fluctuation.

BRIEF DESCRIPTION OF THE DRAWINGS

FIG. 1 is a block diagram showing a schematic constitution of a conventional phase locked loop (PLL) circuit.

FIG. 4 is a block diagram showing a schematic constitution of a second embodiment of the PLL circuit according to the present invention.

FIG. 5 is a diagram showing a relation between on/off states of switches SW1 to SW6 and logic of UP and DOWN signals.

FIG. 6 is a circuit diagram equivalent to FIG. 4, showing an example in which the UP or DOWN signal is at a high level.

DESCRIPTION OF THE PREFERRED EMBODIMENTS

A phase locked loop circuit of the present invention will concretely be described hereinafter with reference to the drawings.

(First Embodiment)

Figure 2:
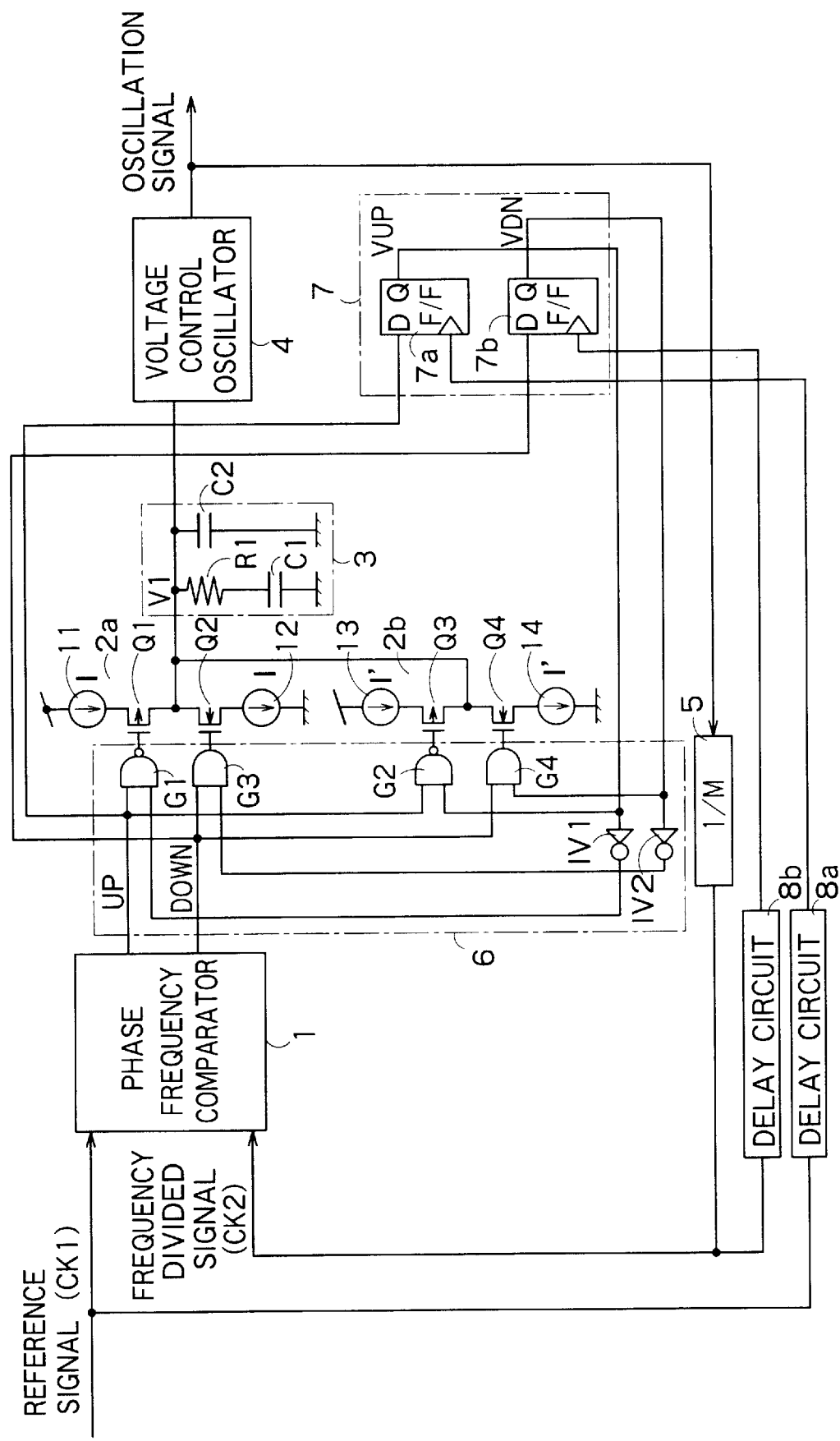
FIG. 2 is a block diagram showing a schematic constitution of a first embodiment of a phase locked loop (PLL) circuit according to the present invention.

FIG. 2 is a block diagram showing a schematic constitution of a first embodiment of the phase locked loop (PLL) circuit according to the present invention. In FIG. 2, constituting components common to those of FIG. 1 are denoted with the same reference numerals, and different respects will mainly be described hereinafter.

The PLL circuit of FIG. 2 is different from the conventional PLL circuit shown in FIG. 1, in that the circuit of FIG. 2 includes a charge pump (first voltage/current converter) 2a for passing a small amount of current, a charge pump (second voltage/current converter) 2b for passing a large amount of current, a changeover section (changeover parts) 6 for selecting either one of the charge pumps 2a, 2b, a phase frequency judging section (phase frequency judging parts) 7 for judging whether or not a pulse width of UP and DOWN signals outputted from the phase frequency comparator 1 exceeds a reference value, and delay circuits 8a, 8b. Constitutions of the phase frequency comparator (phase frequency comparator) 1, voltage control oscillator (oscillator) 4, and frequency divider (frequency dividing parts) 5 are the same as the conventional constitutions.

The charge pump 2a includes a constant current source 11 connected in series between a power source terminal and a ground terminal, PMOS transistor Q1, NMOS transistor Q2 and constant current source 12. Moreover, the charge pump 2b includes a constant current source 13 connected in series between the power source terminal and the ground terminal, PMOS transistor Q3, NMOS transistor Q4 and constant current source 14. When gate lengths L and gate widths W of the respective transistors Q1 to Q4 in the respective charge pumps are adjusted, a larger current can be passed through the charge pump 2b than the charge pump 2a.

The changeover section 6 includes NAND gates G1, G2, AND gates G3, G4, and inverters IV1, IV2. When the pulse width of the UP or DOWN signal exceeds a reference value T, the charge pump 2b for passing the large amount of current is selected. When the pulse width of the UP or DOWN signal indicates the reference value T or less, the charge pump 2a for passing the small amount of current is selected.

The phase frequency judging section 7 includes a flip-flop (first latch parts) 7a for latching the UP signal at a rising edge of an output signal of the delay circuit, and a flip-flop (second latch parts) 7b for latching the DOWN signal at the rising edge of the output signal of the delay circuit.

The delay circuit (first delay parts) 8a outputs the reference signal CK1 delayed by the reference value T, and the delay circuit (second delay parts) 8b outputs the frequency divided signal CK2 delayed by the reference value T. Additionally, the time which is delayed in the delay circuit 8a or 8b is not necessarily the same.

An output of the flip-flop 7a reaches its high level, when phase and frequency differences of the frequency divided signal CK2 are delayed behind the reference signal CK1 by the reference value T or more. Moreover, the output of the flip-flop 7b reaches its high level, when the phase and frequency differences of the frequency divided signal CK2 are delayed by the reference value T or more.

Figure 3A:
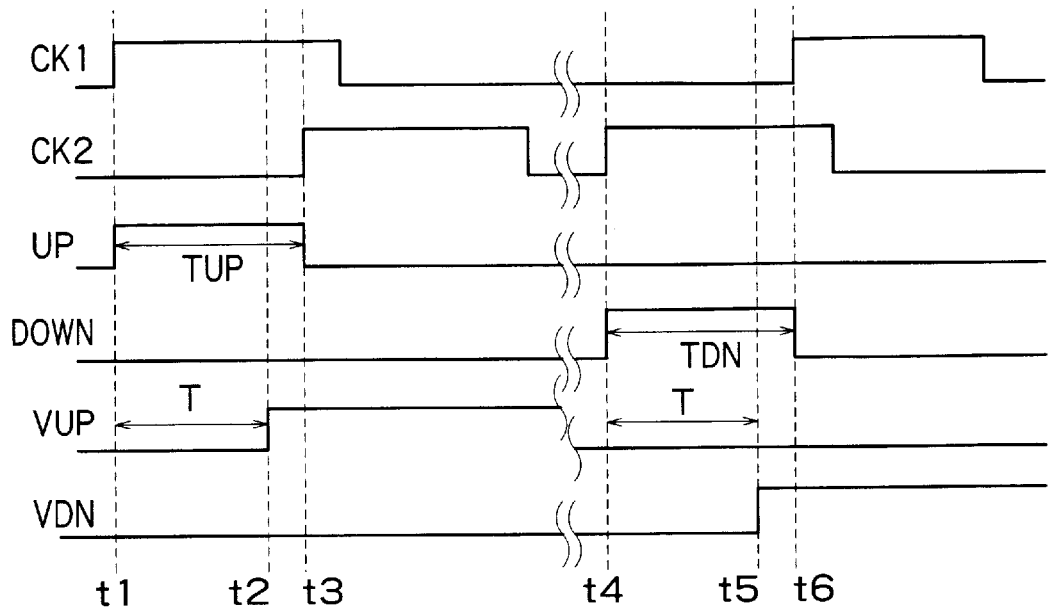
FIGS. 3A and 3B are operation timing charts of the PLL circuit of FIG. 2.
Figure 3B:
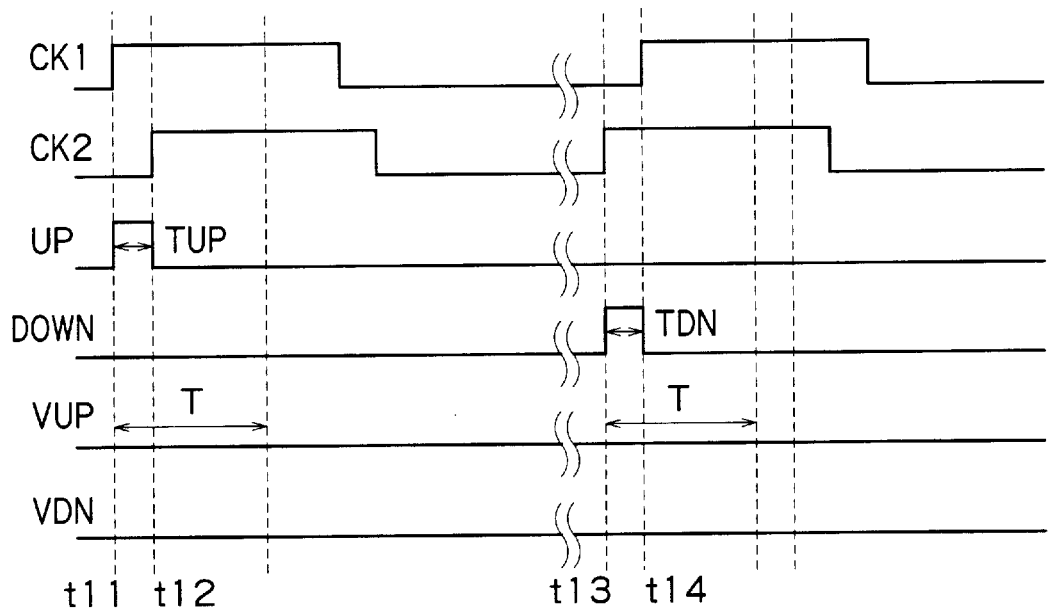

FIG. 3 shows operation timing charts of the PLL circuit of FIG. 2, FIG. 3A shows an example in which the pulse width of the UP or DOWN signal is larger than the reference value T, and FIG. 3B shows an example in which the pulse width of the UP or DOWN signal is equal to or less than that of the reference value T. The operation of the PLL circuit of FIG. 2 will be described based on FIG. 3.

When the phase and frequency differences of the frequency divided signal CK2 are behind the reference value T as compared with the reference signal CK1, the UP signal having a pulse width larger than the reference value T is outputted from the phase frequency comparator 1. Therefore, at a time (time t2 of FIG. 3A) after the reference value T from a time t1 at which the UP signal reaches the high level, Q output of the flip-flop 7a reaches the high level.

Since Q outputs of the flip-flops 7a and 7b are at the low level between time t1 and t2, the charge pump 2a for passing the small amount of current is selected. Moreover, since the UP signal is at the high level in this period, the small amount of current flows to the loop filter 3 from the charge pump 2a, and control is performed to raise the frequency of the oscillation signal of the voltage control oscillator 4.

Subsequently, the Q output of the flip-flop 7a is at the high level between the time t2 and a time t3 at which the frequency divided signal CK2 rises. Therefore, the charge pump 2b for passing the large amount of current is selected. Therefore, the large amount of current flows to the loop filter 3 from the charge pump 2b, and control is performed to rapidly raise the frequency of the oscillation signal of the voltage control oscillator 4.

On the other hand, after time t4 of FIG. 3A, the DOWN signal having a pulse width larger than the reference value T is outputted from the phase frequency comparator 1. Therefore, at a time t5 after the reference value T from when the DOWN signal reaches the high level, the Q output of the flip-flop 7b reaches the high level.

Since the Q output of the flip-flop 7a or 7b is at the low level between the time t4 and t5, the charge pump 2a for passing the small amount of current is selected. Moreover, since the DOWN signal is at the high level in this period, the small amount of current flows to the charge pump 2a from the loop filter 3, and control is performed to lower the frequency of the oscillation signal of the voltage control oscillator 4.

Subsequently, the Q output of the flip-flop 7b is at the high level between the time t5 and a time t6 at which the reference signal CK1 reaches the high level. Therefore, the charge pump 2b for passing the large amount of current is selected. Therefore, the large amount of current flows to the charge pump 2b from the loop filter 3, and control is performed to rapidly lower the frequency of the oscillation signal of the voltage control oscillator 4.

On the other hand, when the phase of the frequency divided signal CK2 is behind the reference signal CK1 by less than the reference value T, the UP signal having the pulse width of the reference value T or less is outputted from the phase frequency comparator 1. Therefore, the Q output of either flip-flop 7a or 7b has the low level, and the charge pump 2a for passing the small amount of current is selected.

In this case, only in the period (time t11 to t12 of FIG. 3B) in which the UP signal has the high level, the small amount of current flows to the loop filter 3 from the charge pump 2b, and control is performed to raise the frequency of the oscillation signal of the voltage control oscillator 4.

On the other hand, after time t13 of FIG. 3B, the DOWN signal having the pulse width equal to or less than that of the reference value T is outputted from the phase frequency comparator 1. Therefore, also in this case, the charge pump 2a for passing the small amount of current is selected. Only in the period (time T13 to T14 of FIG. 3B) in which the DOWN signal has the high level, the small amount of current flows to the charge pump 2 from the loop filter 3, and control is performed to lower the frequency of the oscillation signal of the voltage control oscillator 4.

As described above, in the first embodiment, it is judged whether or not the phase and frequency differences between the reference signal CK1 and the frequency divided signal CK2 exceed the reference value T. When the differences exceed the reference value T, the charge pump for passing a large amount of current 2 is selected, and the current of the charge pump 2 is increased. Therefore, a time required for allowing the phase and frequency differences to agree with the reference value (frequency taking time and lock-in time) can be shortened. Moreover, when the phase and frequency differences are small, the current of the charge pump 2 is decreased, a jitter component is reduced, and the stable oscillation signal can be outputted. Furthermore, since the current of the charge pump 2 can be adjusted for the UP and DOWN signals independent of each other, fine control is possible.

(Second Embodiment)

In a second embodiment, the current of the charge pump 2 is variably controlled in accordance with a voltage at both ends of a resistor in the loop filter 3.

FIG. 4 is a block diagram showing a schematic constitution of a second embodiment of the PLL circuit according to the present invention. In FIG. 4, constituting components common to those of FIG. 2 are denoted with the same reference numerals, and different respects will mainly be described hereinafter.

The PLL circuit of FIG. 4 is different from the PLL circuit of FIG. 2 in that the circuit includes a capacitor C3 for detecting a voltage at both ends of a resistance element R1 in the loop filter (loop filter) 3, switches SW1 to SW4 for changing a connection relation between the capacitor C3 and the loop filter 3, a voltage/current converter (current adjusting parts) 9 for controlling the current of a charge pump 2c, a capacitor C4 and reference power source Vref connected in series between an input terminal and a ground terminal of the voltage/current converter 9, switches SW5 and SW6 for changing whether or not the voltage at both ends of the capacitor C3 is added to the voltage at both ends of the capacitor C4, and OR circuit G5 and inverter IV3 for controlling the changeover of the switches SW5 and SW6. Here, the capacitor C3 corresponds to voltage detector.

Additionally, the loop filter 3 also includes a lag lead filter, lag filter, and RC active filter.

The voltage/current converter 9 includes an operating amplifier 11, PMOS transistors Q5, Q6 controlled to turn on/off in accordance with an output voltage of the operating amplifier 11, a resistor element R2, and a NMOS transistor Q7 for functioning as a diode.

The charge pump 2c includes transistors Q8 to Q11 connected in series between a power source terminal and a ground terminal. The PMOS transistor Q8 is mirror-connected to the PMOS transistors Q5, Q6 in the voltage/current converter 9. Similarly, the NMOS transistor Q11 is mirror-connected to the NMOS transistors Q7 in the voltage/current converter 9.

FIG. 5 is a diagram showing a relation between on/off states of switches SW1 to SW6 of FIG. 4 and logic of UP and DOWN signals. As shown in FIG. 5, when the UP signal reaches the high level, only the switches SW1, SW2 turn on. When the DOWN signal reaches the high level, only the switches SW3, SW4 turn on.

Here, the switches SW1, SW2 correspond to first changeover parts, the switches SW3, SW4 correspond to second changeover parts, and the switches SW5, SW6 correspond to third changeover parts.

FIG. 6 is a circuit diagram equivalent to FIG. 4, showing an example in which the UP or DOWN signal is at the high level. In this case, since only the switches SW1, SW2 turn on, or only the switches SW3, SW4 turn on, the capacitor C3 is connected in parallel to the resistance element R1 in the loop filter 3.

When the UP signal reaches the high level, the current flows to the loop filter 3 from the charge pump 2c along an arrow Y1 of FIG. 6, and the voltage at both ends of the capacitor C3 becomes the same as the voltage at both ends of the resistance element R1 in the loop filter 3.

When the DOWN signal reaches the high level, the current flows to the charge pump 2c from the loop filter 3 along an arrow Y2 of FIG. 6, and the voltage at both ends of the capacitor C3 becomes the same as the voltage at both ends of the resistance element R1 in the loop filter 3.

Additionally, the connection between the capacitor C3 and the resistance element R1 when the UP signal reaches the high level is reversed to the connection when the DOWN signal reaches the high level. Therefore, a direction of the voltage with which the capacitor C3 is charged is reversed. That is, when the UP signal is at the high level, switches SW2 and SW6 of the capacitor C3 become positive polarity. When the DOWN signal is at the high level, switches SW1 and SW5 of the capacitor C3 become positive polarity.

Figure 7:
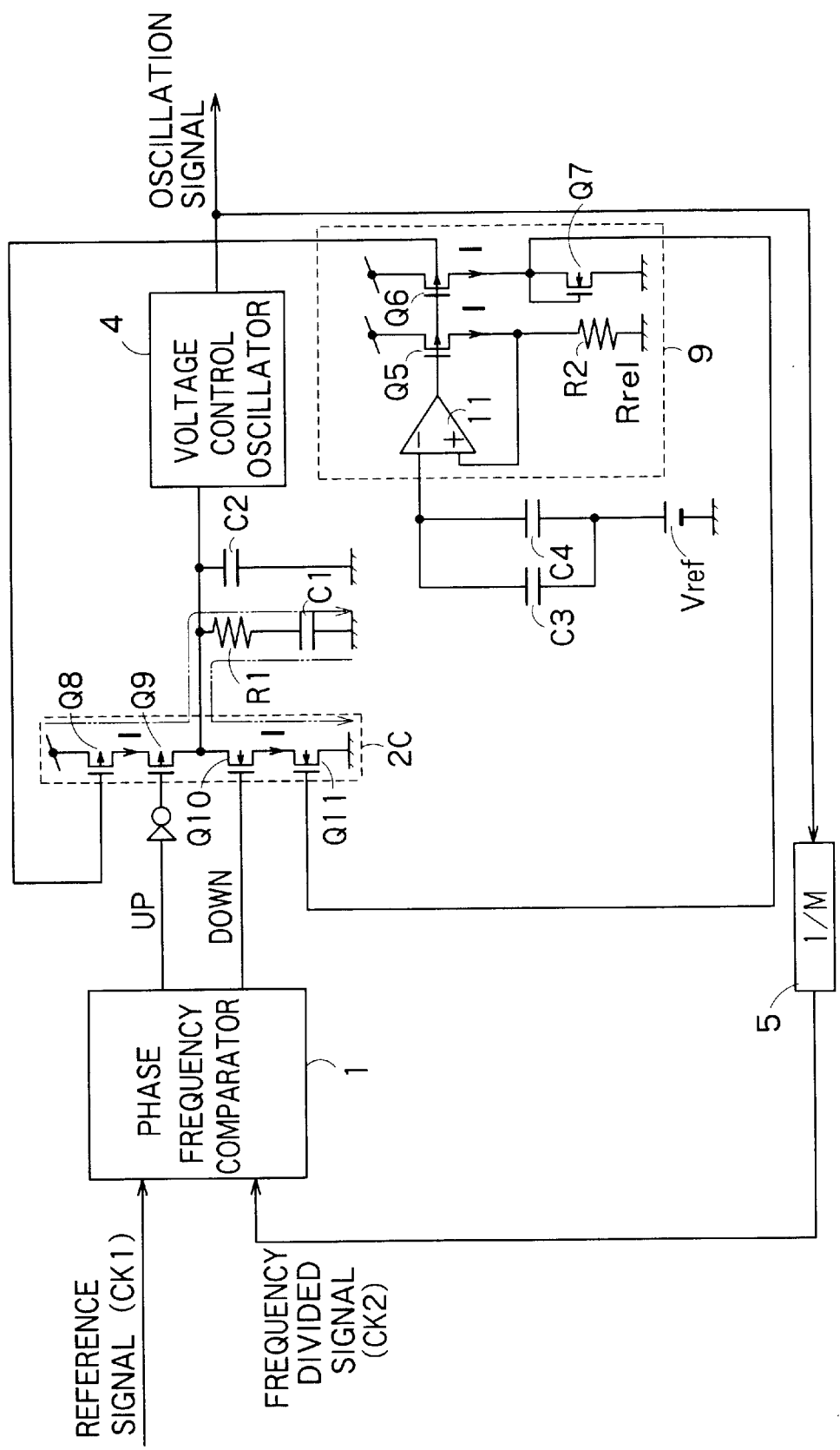
FIG. 7 is a circuit diagram equivalent to FIG. 4, showing an example in which the UP and DOWN signals are at a low level.

On the other hand, FIG. 7 is a circuit diagram equivalent to FIG. 4, showing an example in which the UP and DOWN signals are both at the low level. In this case, since only the switches SW5 and SW6 turn on, the capacitors C3 and C4 are connected in parallel, and the voltage (V1-V2) at both ends of the capacitor C3 is added to the input terminal of the voltage/current converter 9.

Concretely, the longer the high level periods of the UP signal and the DOWN signal are, the higher the input voltage of the voltage/current converter 9 becomes when the UP signal and the DOWN signal become a low level, and a larger amount of current flows in the transistor in the voltage/current converter 9. Since the transistors Q5, Q6 in the voltage/current converter 9 have a mirror constitution with the transistor Q8 in the charge pump 2c, the current of the charge pump 2c also increases, and control is performed to raise or lower the oscillation frequency of the voltage control oscillator 4.

Figure 8:
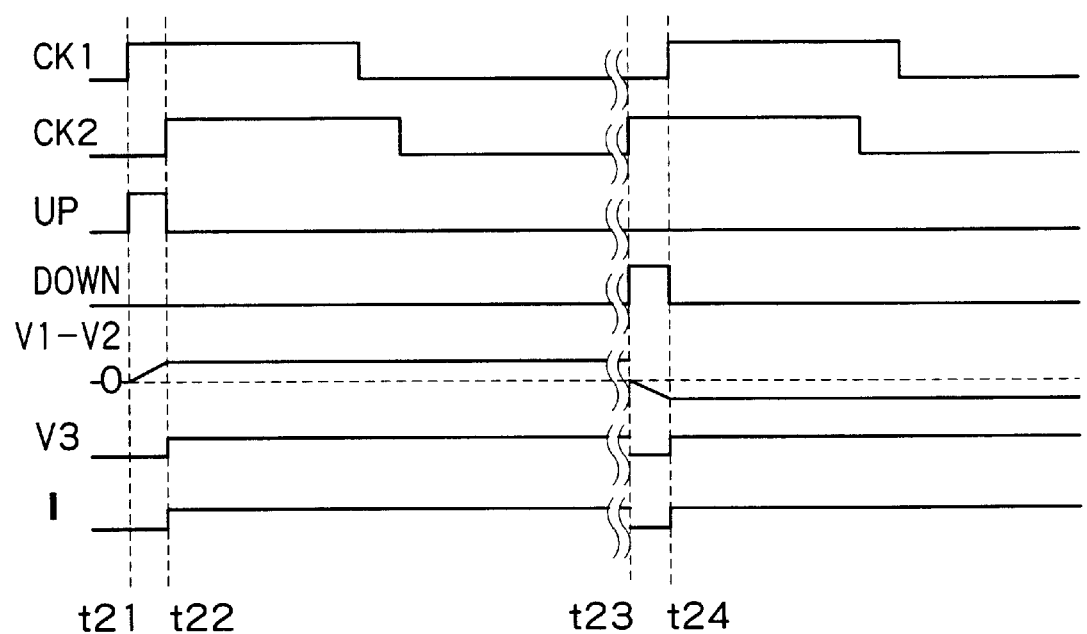
FIG. 8 is an operation timing chart of the PLL circuit of FIG. 6.

FIG. 8 is an operation timing chart of the PLL circuit of FIG. 6. Operation of the PLL circuit of FIG. 6 will be described hereinafter with reference to FIG. 8. At time t21 at which the reference signal CK1 rises earlier than the frequency divided signal CK2, the UP signal outputted from the phase frequency comparator 1 reaches the high level. Subsequently, till t22 at which the frequency divided signal CK2 rises, the UP signal holds the high level.

Between time t21 and t22, the switches SW1 and SW2 are on, the circuit becomes equivalent to FIG. 6, and a charge is accumulated in the capacitor C3 in accordance with the voltage at both ends of the resistance element R1 in the loop filter 3.

At the time t22, since the UP signal is at the low level, the switches SW1, SW2 are turned off, and instead the switches SW5, SW6 turn on. Thereby, the voltage of the non-reverse input terminal of the operating amplifier 11 in the voltage/current converter 9 increases by the voltage at both ends of the capacitor C3, and the current flowing through the charge pump 2c also increases.

On the other hand, since the frequency divided signal CK2 rises earlier than the reference signal CK1 at the time t23, the DOWN signal outputted from the phase frequency comparator 1 reaches the high level. Subsequently, till time t24 at which the reference signal CK1 rises, the DOWN signal holds the high level.

Between the time t23 and t24, the switches SW3, SW4 are on, the circuit becomes equivalent to FIG. 6, and the charge is accumulated in the capacitor C3 in accordance with the voltage at both ends of the resistance element R1 in the loop filter 3. Additionally, the direction in which the charge is accumulated at the time t21 is reverse to that of the time t21 to t22.

At the time t24, the DOWN signal is at the low level, the switches SW3 and SW4 are turned off, and instead the switches SW5, SW6 turn on. Thereby, the voltage of the non-reverse input terminal of the operating amplifier 11 in the voltage/current converter 9 increases by the voltage at both ends of the capacitor C3, and the current flowing through the charge pump 2c also increases.

On the other hand, when the PLL circuit of FIG. 6 is in a locked state, that is, when the phase and frequency differences between the reference signal CK1 and the frequency divided signal CK2 are small, the pulse width of the UP or DOWN signal is shortened, the voltage at both ends of the capacitor C3 is also reduced, and the current flowing through the charge pump 2c is reduced. Therefore, the jitter component is reduced, and the stable clock can be outputted. Moreover, the charge pump current can precisely be controlled in proportion to the pulse width of the UP or DOWN signal.

Moreover, in the second embodiment, based on a result of the detected voltage at both ends of the resistance element R1 in the loop filter 3, response characteristics of a phase locked loop are identified, and the charge pump current is variably controlled in order to constantly optimize a response of the phase locked loop. Therefore, it is possible to constantly allow the PLL circuit to operate in an optimum state independently of a manufacturing dispersion, power voltage, and temperature fluctuation.

Additionally, the example in which the voltage at both ends of the resistance element R1 in the loop filter 3 is detected by the capacitor C3 has been described with reference to 2 FIG. 6, but the voltage at both ends may be detected by a technique other than the capacitor C3 For example, a differential A/D converter may be used to detect the voltage at both ends of the resistance in the loop filter 3, and the current of the charge pump 2c may be controlled based on the output of the A/D converter.

What is claimed is:

1. A phase locked loop circuit comprising:
   a phase frequency comparator configured to output an up/down signal indicating a phase difference and a frequency difference between a reference signal and a frequency divided signal;
   a charge pump configured to output a current signal in accordance with said up/down signal;
   an oscillator configured to output an oscillation signal of a frequency in accordance with said current signal;
   frequency dividing parts configured to divide the frequency of said oscillation signal and generating said frequency divided signal;
   phase frequency judging parts configured to judge whether or not the phase difference and the frequency difference between said reference signal and said frequency divided signal exceed a predetermined reference value; and
   changeover parts configured to switch a value of a current flowing through said charge pump depending upon whether or not the phase difference and the frequency difference between said reference signal and said frequency divided signal exceed said reference value.

2. The phase locked loop circuit according to claim 1, wherein said charge pump includes:
   a first voltage/current converter configured to output the current signal in accordance with said up/down signal; and
   a second voltage/current converter which can output a current more than said first voltage/current converter and which outputs the current signal in accordance with the up/down signal, and
   wherein said changeover parts outputs the current signal via said second voltage/current converter when it is judged that the phase difference and the frequency difference exceed said reference value, and outputs the current signal via said first voltage/current converter when it is judged that the phase difference and the frequency difference is equal to or less than said reference value.

3. The phase locked loop circuit according to claim 2, wherein said phase frequency comparator outputs an up signal indicating that a phase of said reference signal is ahead of the phase of said frequency divided signal, and a down signal indicating that the phase of said reference signal is later than that of said frequency divided signal,
   said phase frequency judging parts includes:
   first latch parts configured to latch said up signal at a first timing;
   second latch parts configured to latch said down signal at a second timing, and
   said changeover parts selects either one of said first and second voltage/current converters based on a latch output of said first and second latch parts to output said current signal.

4. The phase locked loop circuit according to claim 3, wherein said changeover parts allows said second voltage/current converter to output the current signal, when said up signal is outputted during latching by said first latch parts, or when said down signal is outputted during latching by said second latch parts, and allows said first voltage/current converter to output the current signal, when said up signal is not outputted during latching of said first latch parts, or when said down signal is not outputted during latching of said second latch parts.

5. The phase locked loop circuit according to claim 3, further comprising:
   first delay parts configured to delay said reference signal by a first period; and
   second delay parts configured to delay said frequency divided signal by a second period,
   wherein said first latch parts latches said up signal based on the signal delayed by said first delay parts, and
   said second latch parts latches said down signal based on the signal delayed by said second delay parts.

6. The phase locked loop circuit according to claim 5, wherein said first period has a time equal to that of the second period.

7. The phase locked loop circuit according to claim 1, wherein said changeover parts adjusts a value of a current flowing through said charge pump separately for said up signal and said down signal.

8. A phase locked loop circuit comprising:
   phase frequency comparator configured to output an up/down signal indicating a phase difference and a frequency difference between a reference signal and a frequency divided signal;
   a charge pump configured to output a current signal in accordance with said up/down signal;
   a loop filter, configured to remove a high frequency component included in said current signal, said loop filter having a resistance element;
   an oscillator configured to output an oscillation signal of a frequency in accordance with an output voltage of said loop filter;
   frequency dividing parts configured to divide the frequency of said oscillation signal to generate said frequency divided signal;
   a voltage detector configured to detect a voltage at both ends of said resistance element in said loop filter; and
   current adjusting parts configured to adjust a value of a current flowing through said charge pump based on the detected voltage.

9. The phase locked loop circuit according to claim 8, wherein said current adjusting parts adjusts the value of the current flowing through said charge pump in such a manner that the value of the current flowing through said charge pump increases with a larger absolute value of the voltage detected by said voltage detector.

10. The phase locked loop circuit according to claim 8, further comprising:
    a first capacitor element which can be connected in parallel to said resistance element in said loop filter;
    first changeover parts configured to change whether or not said first capacitor element is connected in parallel to said resistance element;
    second changeover parts configured to change whether or not said first capacitor element is connected in parallel to said resistance element in a direction opposite to the direction of said first changeover parts; and
    third changeover parts configured to change whether or not a voltage at both ends of said first capacitor element is supplied to said current adjusting parts,
    wherein said phase frequency comparator outputs an up signal indicating that a phase of said reference signal is ahead of the phase of said frequency divided signal, and a down signal indicating that the phase of said reference signal is later than that of said frequency divided signal,
    said first changeover parts connects said first capacitor element in parallel to said resistance element, when said up signal is outputted,
    said second changeover parts connects said first capacitor element in parallel to said resistance element, when said down signal is outputted, and
    said third changeover parts supplies the voltage at both ends of said first capacitor element to said current adjusting parts, when neither said up signal nor said down signal is outputted.

11. The phase locked loop circuit according to claim 10, wherein said current adjusting parts includes:
    a differential amplifier; and
    a second capacitor element and a reference voltage source connected in series between one input terminal and a ground terminal of said differential amplifier, and
    wherein said third changeover parts connects said second capacitor element in parallel to said first capacitor element, when neither said up signal nor said down signal is outputted.

12. The phase locked loop circuit according to claim 11, wherein said current adjusting parts includes a first transistor configured to pass a current in accordance with an output of said differential amplifier, and
    said charge pump includes a second transistor having a mirror constitution with said first transistor.

13. The phase locked loop circuit according to claim 8, wherein said loop filter is constituted of at least one of a lag lead filter, a lag filter, and an RC active filter.

14. The phase locked loop circuit according to claim 8, wherein said current adjusting parts adjusts a value of a current flowing through said charge pump separately for said up signal and said down signal.

* * * * *